(12) United States Patent
Chen

(10) Patent No.: US 9,949,360 B2
(45) Date of Patent: Apr. 17, 2018

(54) PRINTED CIRCUIT BOARD DESIGN FOR HIGH SPEED APPLICATION

(75) Inventor: Nan-Jang Chen, Hsinchu (TW)

(73) Assignee: MEDIATEK INC., Hsin-Chu (TW)

( * ) Notice: Subject to any disclaimer, the term of this patent is extended or adjusted under 35 U.S.C. 154(b) by 3 days.

(21) Appl. No.: 13/408,062

(22) Filed: Feb. 29, 2012

(65) Prior Publication Data

US 2012/0228006 A1    Sep. 13, 2012

Related U.S. Application Data

(60) Provisional application No. 61/451,283, filed on Mar. 10, 2011.

(51) Int. Cl.
*H05K 1/02*      (2006.01)
*H01P 3/08*      (2006.01)

(52) U.S. Cl.
CPC ......... *H05K 1/0219* (2013.01); *H05K 1/0224* (2013.01); *H01P 3/08* (2013.01); *H05K 1/0298* (2013.01); *H05K 2201/0715* (2013.01); *H05K 2201/09236* (2013.01)

(58) Field of Classification Search
CPC ......... H05K 1/0218; H05K 2201/0715; H05K 1/0393; H05K 3/4664; H05K 2201/09236; H05K 1/0216; H05K 1/0219
See application file for complete search history.

(56) References Cited

U.S. PATENT DOCUMENTS

| 3,740,678 | A | * | 6/1973 | Hill ............................... 333/238 |
| 5,219,607 | A | * | 6/1993 | Kawakami ........... H05K 3/4685 |
|  |  |  |  | 427/126.3 |
| 5,837,427 | A |   | 11/1998 | Hwang et al. |
| 5,973,931 | A | * | 10/1999 | Fukasawa ......... H01L 23/49838 |
|  |  |  |  | 174/255 |

(Continued)

FOREIGN PATENT DOCUMENTS

| CN | 1722940 | 1/2006 |
| CN | 1741706 | 3/2006 |

(Continued)

OTHER PUBLICATIONS

English language translation of abstract of CN 1722940 (published Jan. 18, 2006).

(Continued)

*Primary Examiner* — Ishwarbhai B Patel
(74) *Attorney, Agent, or Firm* — McClure, Qualey & Rodack, LLP

(57) ABSTRACT

A printed circuit board (PCB) is disclosed. The PCB includes a substrate have a top surface and a bottom surface. A first conductive layer is disposed on the top surface of the substrate. The first conductive layer comprises a first signal net and a second signal net. An outermost insulating layer is disposed on the top surface of the substrate to cover the substrate and the first conductive layer. The outmost insulating layer comprises an opening to expose a portion of the second signal net. And, a second conductive layer is dis- (Continued)

posed on the outermost insulating layer and substantially covering at least a portion of the first signal net. The second conductive layer is filled into the opening to electrically connect to the second signal net which is able to provide one of a ground potential and a power potential.

19 Claims, 15 Drawing Sheets

(56) References Cited

U.S. PATENT DOCUMENTS

| | | | | |
|---|---|---|---|---|
| 5,981,043 | A * | 11/1999 | Murakami | H05K 1/095 |
| | | | | 174/257 |
| 6,353,189 | B1 * | 3/2002 | Shimada et al. | 174/255 |
| 6,523,252 | B1 * | 2/2003 | Lipponen | 29/828 |
| 7,429,702 | B2 * | 9/2008 | Kobayashi et al. | 174/117 FF |
| 8,058,559 | B2 * | 11/2011 | Muro | H05K 1/0218 |
| | | | | 174/254 |
| 8,471,154 | B1 * | 6/2013 | Yoshida | H01L 23/3128 |
| | | | | 174/260 |
| 2003/0188889 | A1 * | 10/2003 | Straub et al. | 174/262 |
| 2007/0111380 | A1 | 5/2007 | Cho et al. | |
| 2008/0078573 | A1 * | 4/2008 | Hu et al. | 174/262 |
| 2008/0143358 | A1 | 6/2008 | Breinlinger | |
| 2008/0283286 | A1 * | 11/2008 | Honjo | 174/262 |
| 2008/0296048 | A1 * | 12/2008 | Muro et al. | 174/254 |
| 2009/0000804 | A1 * | 1/2009 | Kobayashi | H01P 3/08 |
| | | | | 174/117 F |
| 2009/0038839 | A1 | 2/2009 | Hashimoto et al. | |
| 2009/0188702 | A1 | 7/2009 | Muro et al. | |
| 2009/0251876 | A1 | 10/2009 | Chen et al. | |
| 2010/0060390 | A1 | 3/2010 | Okada | |
| 2010/0326706 | A1 | 12/2010 | Muro et al. | |

FOREIGN PATENT DOCUMENTS

| | | |
|---|---|---|
| CN | 2886982 | 4/2007 |
| CN | 101647326 | 2/2010 |
| CN | 101861057 | 10/2010 |
| EP | 1 775 737 | 4/2007 |
| TW | 200719780 | 5/2007 |
| WO | WO 2010/103722 | 9/2010 |

OTHER PUBLICATIONS

English language translation of abstract of CN 2886982 (published Apr. 4, 2007).
English language translation of abstract of CN 101861057 (published Oct. 13, 2010).
English language translation (machine translation) of CN 1741706 (published Mar. 1, 2006).
English language translation (machine translation) of CN 101647326 (published Feb. 10, 2010).
Texas Instruments; "High Speed Analog Design and Application Seminar 5-1;" Mar. 2005; pp. 1-42.

* cited by examiner

PRINTED CIRCUIT BOARD DESIGN FOR HIGH SPEED APPLICATION

CROSS REFERENCE TO RELATED APPLICATIONS

This application claims the benefit of U.S. Provisional Application No. 61/451,283, filed Mar. 10, 2011, the entirety of which is incorporated by reference herein.

BACKGROUND OF THE INVENTION

Field of the Invention

The invention relates to a printed circuit board and more particularly to a printed circuit board design with good signal quality.

Description of the Related Art

Typically, a printed circuit board (PCB) is a layered insulating structure with internal and external traces/planes that allows electronic devices/components on the printed circuit board to be electrically connected to each other and to the outside environment. Printed circuit boards are the most commonly used packaging medium for electronic circuits. Due to the demand for high performance systems, packaging density and propagation speeds have increased, to force the technological development of the printed circuit boards to evolve from being single-sided to double-sided or multilayered.

Notwithstanding, along with rapid advances in printed circuit board technology, electromagnetic interference (EMI) problems have increased in severity. When electronic devices/components operate in high speed and are allocated in the PCB with a high device density, noise may be generated and affect the operation of other electronic devices. In a good printed circuit board design, signal delay, distortion and crosstalk noise are minimized. Crosstalk is a kind of noise induced primarily by the electromagnetic coupling between signal lines and degrades signal quality. In printed circuit boards, crosstalk occurs by the electrical coupling between nearby signal traces. As more and more functions are integrated on a chip, more circuit traces of the printed circuit board are demanded, and thus the coupling between nearby signal traces have become greater, introducing noise and false signals into systems.

Additionally, referring to FIGS. 8A and 8B, FIG. 8A shows a plan view of a conventional two-layered printed circuit board 300 which shows routing of power and signal planes. FIG. 8B shows a cross section along line 8B-8B' of FIG. 8A. The conventional printed circuit board 300 has a top layer on a top surface 102 of a substrate 100, covered by a solder mask layer 126. The top layer comprises power traces 108a and 108b and a signal trace 112. The conventional printed circuit board 300 also has a bottom layer covered by a solder mask layer 130 comprising a ground plane 140 on a bottom surface 103 of the substrate 100. For descriptive convenience, the solder mask layer 126 is not shown in FIG. 8A. The power traces 108a and 108b are used for providing power potential, and the signal trace 112 is used for transmitting signal or data. As shown in FIG. 8A, the signal trace 112 is substantially placed along a second direction 304 which may form a power transmission barrier between the adjacent power traces 108a and 108b which is substantially placed along a first direction 302, which is not parallel to the second direction 304. As shown in FIG. 8B, in order to transmit power potential between the adjacent power traces 108a and 108b, a conductive trace 108c is formed on a bottom surface 103 of the substrate 100. The conductive trace 108c is respectively electrically connected to the power traces 108a and 108b by via plugs 134 through the substrate 100, and isolated from a split ground plane 140 by a gap 150. As shown in FIG. 8A, the signal trace 112 is across over the gap 150 surrounding the conductive trace 108c. When signals, especially high-speed signals, are transmitted along the signal trace 112, however, the current return path of the high-speed signals not only remains under the signal trace 112, but also transmit along the gap 150 directly under the signal trace 112. The long current return path may generate an undesired magnetic field vertical to the directions 302 and 304, and thus increases the coupling coefficient between adjacent signal traces and exacerbates electromagnetic interference (EMI) problems. A multi-layered PCB, which separates power, signal and ground planes in various layers, may be used to mitigate the aforementioned problems, but increasing layers of the PCB will also raise the manufacturing cost of the printed circuited board.

Accordingly, there is a need to develop printed circuit board designs which are capable of mitigating the aforementioned problems.

BRIEF SUMMARY OF THE INVENTION

Printed circuit boards are provided. An exemplary embodiment of a printed circuit board comprises a substrate having a top surface and a bottom surface. A first conductive layer is disposed on the top surface of the substrate. The first conductive layer comprises a first signal net and a second signal net. An outermost insulating layer is disposed on the top surface of the substrate to cover the substrate and the first conductive layer. The outmost insulating layer comprises an opening to expose a portion of the second signal net. And, a second conductive layer is disposed on the outermost insulating layer and substantially covering at least a portion of the first signal net. The second conductive layer is filled into the opening to electrically connect to the second signal net which is able to provide one of a ground potential and a power potential.

BRIEF DESCRIPTION OF DRAWINGS

The invention can be more fully understood by reading the subsequent detailed description and examples with references made to the accompanying drawings, wherein.

DETAILED DESCRIPTION OF INVENTION

Figure 1:
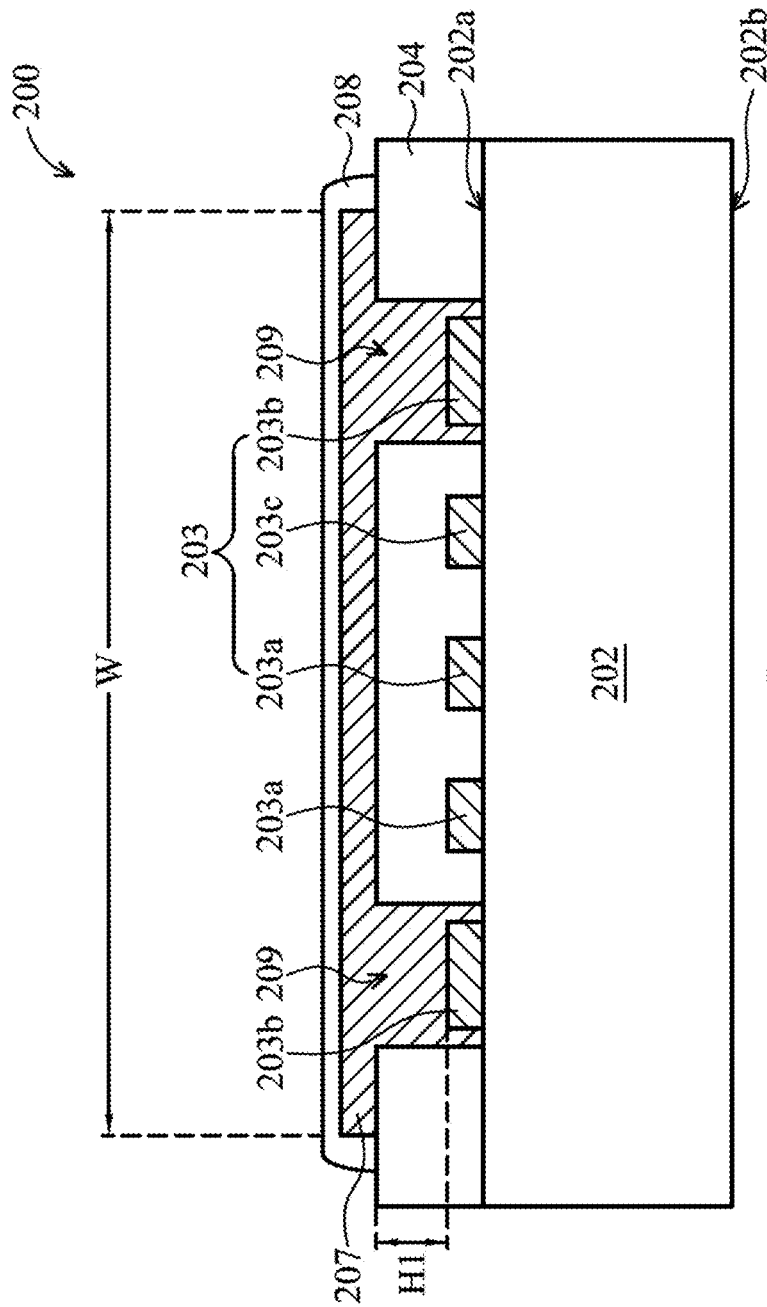
FIG. 1 illustrates a cross section of an exemplary embodiment of a one-layered printed circuit board according to the invention.

The following description encompasses the fabrication and the purpose of the invention. It can be understood that this description is provided for the purpose of illustrating the fabrication and the use of the invention and should not be taken in a limited sense. In the drawings or disclosure, the same or similar elements are represented or labeled by the same or similar symbols. Moreover, the shapes or thicknesses of the elements shown in the drawings may be magnified for simplicity and convenience. Additionally, the elements not shown or described in the drawings or disclosure are common elements which are well known in the art.

In the following various exemplary embodiments, the printed circuit board may comprise net, traces, strip lines, or micro-strip which are made of conductive material to electrically connect various electronic components for transmitting data and/or signals in a high speed manner. Such net, traces, strip lines, or micro-strip may be function as a high-speed signal bus or interface, such as memory interfaces, high-definition multimedia interface (HDMI), serial advanced technology attachment (SATA) interface, universal serial bus (USB), Ethernet interface or low voltage differential signaling (LVDS) interface. Referring to FIG. 1, a cross section of an exemplary embodiment of a one-layered printed circuit board according to one embodiment of the invention is illustrated. In the embodiment, the printed circuit board 200 comprises a substrate 202 made of FR-1, FR-2, FR-4, CEM-1 or CEM-3 material. The substrate 202 has a top surface 202a and a bottom surface 202b. A first conductive layer 203 comprising nets, micro-strips, traces, or strip lines for electrically transmitting signals is formed on the top surface 202a. The first conductive layer 203 is made of conductive material comprising copper, aluminum, copper alloy or aluminum alloy. An outermost insulating layer 204 is formed on the top surface 202a of the substrate 202 to substantially cover the top surface 202a and the first conductive layer 203. In the embodiment, the outermost insulating layer 204 may comprise a solder mask or other suitable dielectric materials, e.g. isolation film, isolation tape or pre-preg.

In one embodiment, the first conductive layer 203 comprises a first signal net 203a and a second signal net 203b and 203c. In one embodiment, the first signal net 203a are electrically connected between electronic components for transmitting signal and/or data. The second signal net 203b and 203c are electrically connected to a ground potential to serve as a ground net. Alternatively, the second signal net 203b and 203c are electrically connected to a power source having a voltage potential to serve as a power net. The first signal net 203a and second signal net 203b and 203c may be patterned to comprise the following structures, either alone or in any combination, including trace, plane, pad, finger, or via hole. The first signal net 203a and second signal net 203b and 203c are substantially covered by the outermost insulating layer 204. In the embodiment of this application, the outermost insulating layer 204 has openings 209 to expose at least a portion of the second signal net 203b. The exposed portion may comprise a pad, a via hole, a portion of a trace or a portion of a plane of the second signal net 203b.

In particular, a second conductive layer 207 is disposed on the outermost insulating layer 204 to substantially cover at least a portion of the first conductive layer 203. In the embodiment, the second conductive layer 207 may be formed of solid metal sheet (such as metal foil/tape which comprises Al, Cu, Ag, or Au). In another embodiment, the second conductive layer 207 can be formed from a conductive epoxy or conductive epoxy adhesive (such as conductive silver, copper, or aluminum epoxy or the like). In another embodiment, the second conductive layer 207 can be manufactured from a polymer conductive composite, conductive polymer, conductive composite polymer, or carbon printing.

The second conductive layer 207 is electrically connected to the second signal net 203b through openings 209 formed in the outermost insulating layer 204 so as to connect to a ground net or a power net. In one embodiment, the openings 209 may be filled with conductive epoxy material or conductive adhesive material so as to form a unity structure with the second conductive layer 207. In another embodiment, a conductive device (not shown), e.g. screw, pin, jumper etc., is placed through the opening 209 to electrically connect the second conductive layer 207 and second signal net 203b. In addition, in yet another embodiment of the application, the second conductive layer 207 electrically connect to second signal net 203b through not only the conductive device but also the conductive epoxy material filled into the openings 209. As a result, the second conductive layer 207 can serve as a reference plane to suppress crosstalk noise between first signal nets nearby.

Crosstalk noise which is raised by adjacent first signal net 203a can be virtually suppressed by the second conductive layer 207 (i.e., the reference plane) in the micro-strip geometry. Note that in order to effectively suppress or eliminate the crosstalk noise between the adjacent first signal net 203a, in one embodiment, a spacing H1 between the second conductive layer 207 and the first signal net 203a on the substrate 202 is less than 1 mm, preferable in a range of 50 μm to 350 μm, such that the first signal net 203a are substantially close to the second conductive layer 207 in a vertical direction with respect to the top surface 202a of the substrate 202. Additionally, an optional first insulating cap layer 208 may be disposed on the outermost insulating layer 204 to cover the second conductive layer 207. The first insulating cap layer 208 may comprise the same or similar material as that of the outermost insulating layer 204 to protect the underlying second conductive layer 207 from mechanical or chemical damage.

Figure 2A:
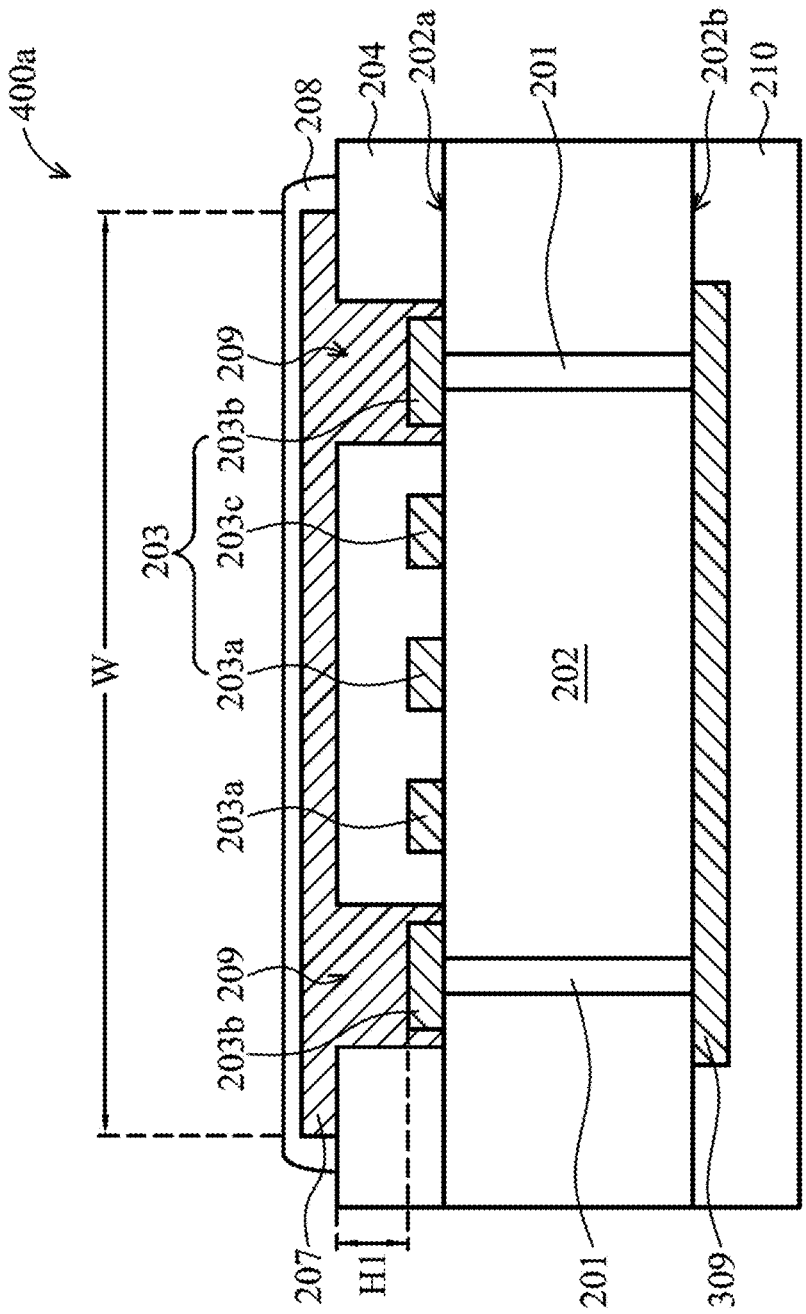
FIG. 2A illustrates a cross section of an exemplary embodiment of a two-layered printed circuit board according to the invention.
Figure 2B:
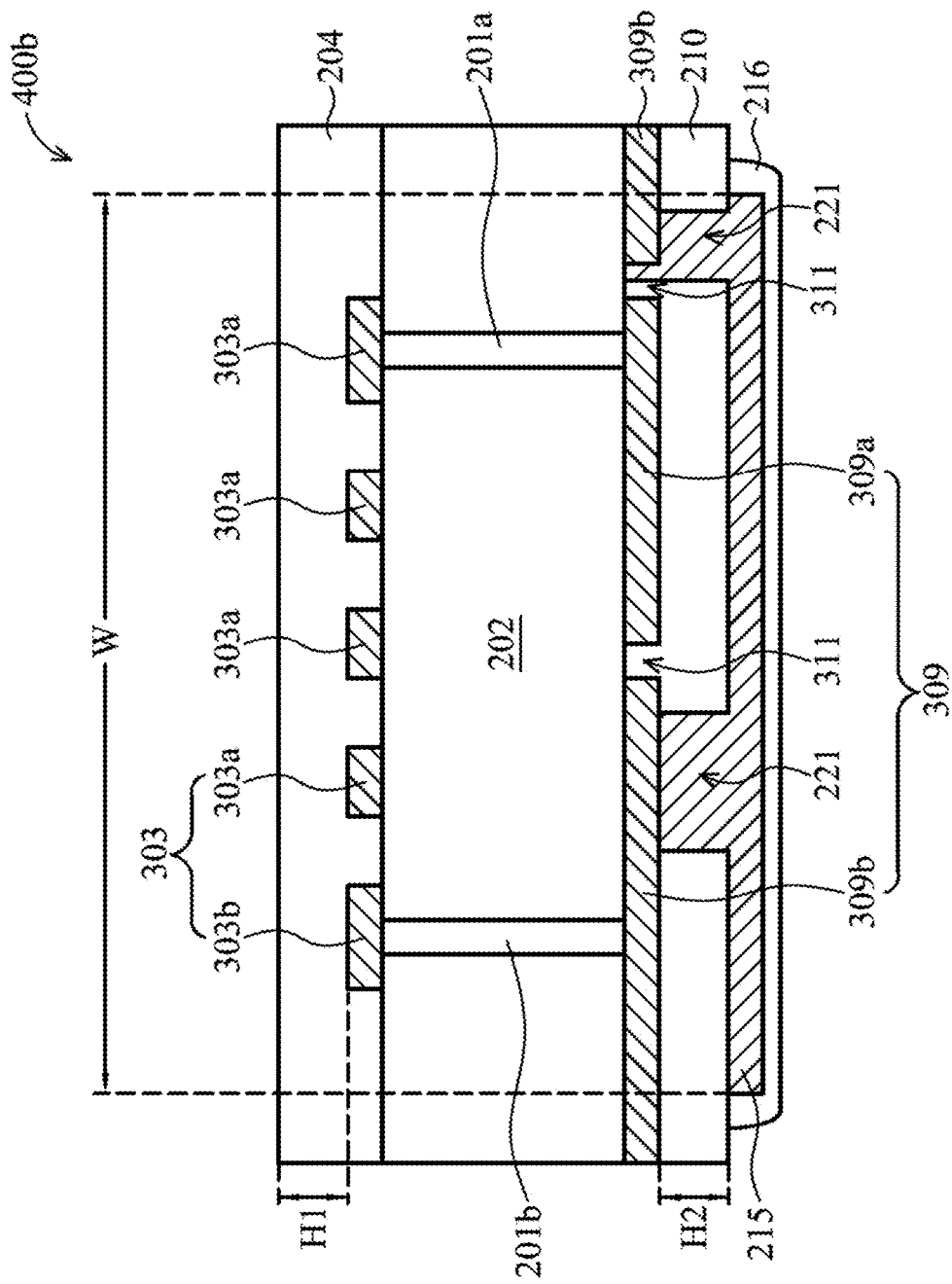
FIG. 2B illustrates a cross section of another exemplary embodiment of a two-layered printed circuit board according to the invention.

Referring to FIGS. 2A and 2B, which illustrate cross sections of various exemplary embodiments of a two-layered printed circuit board. Elements in FIGS. 2A and 2B that are similar to those in FIG. 1 are labeled with the same reference numbers as in FIG. 1 and are not described again for brevity. In FIG. 2A, the two-layered printed circuit board 400a comprises an outermost insulating layer 210 disposed on the bottom surface 202b of the substrate 202. The outermost insulating layer 210 may comprise the same or similar material as that of the outermost insulating layer 204. Moreover, a third conductive layer 309 is disposed on the bottom surface 202b of the substrate 202 and is embedded in the outermost insulating layer 210. Typically, the third conductive layer 309 may comprise same or similar material as that of the first conductive layer 203 and serves as a ground or power net.

In one embodiment, the second conductive layer 207 may be electrically connected to the third conductive layer 309 through openings 209, second signal net 203b, and via holes 201. The openings 209 are filled with conductive epoxy material or conductive adhesive material so as to form a unity structure with the second conductive layer 207. As a result, since the second conductive layers 207 and the third conductive layer 309 can serve as reference planes, crosstalk noise between the adjacent first signal nets 203a of the printed circuit board 400a can be virtually suppressed by the second conductive layer 207 and the third conductive layer 309 in the micro-strip geometry.

In FIG. 2B, the two-layered printed circuit board 400b comprises outermost insulating layers 204 and 210 disposed on the top and bottom surfaces 202a and 202b of the substrate 202, respectively. A first conductive layer 303 comprises a plurality of non-ground net 303a (such as signal net and/or power net) and at least one ground net 303b which are embedded in the outermost insulating layer 204. The plurality of non-ground net 303a are substantially coplanar with the ground net 303b. Moreover, the plurality of non-ground net 303a and the ground net 303b are formed of the same conductive material, such as copper, aluminum, copper alloy or aluminum alloy.

A third conductive layer 309 comprises at least one non-ground net 309a (such as signal net or power net) and a ground net 309b. The non-ground net 309a and the ground net 309b are disposed on the bottom surface 202b of the substrate 202, and are embedded in the outermost insulating layer 210, in which the non-ground net 309a is placed adjacent to the ground net 309b. Moreover, that the non-ground net 309a is isolated from the ground net 309b by gap 311. Additionally, the ground net 309b is electrically connected to the ground net 303b through a via hole 201b formed in the substrate 202. The non-ground net 309a is electrically connected to one of the plurality of non-ground net 303a by a via hole 201a formed in the substrate 202. The ground net 309b may be patterned to comprise the following structures, either alone or in any combination, including trace, plane, pad, finger, or via hole.

A long current return path due to the split ground net 309b may generate an undesired magnetic field, and thus increases the coupling coefficient between adjacent signal nets and exacerbates electromagnetic interference (EMI) problems (S. H. Hall, G. W. Hall, and J. A. McCall, *High-Speed Digital System Design*. New York, N.Y.: John Wiley & Sons, 2000, ch. 6.). Accordingly, in the embodiment, a fourth conductive layer 215 serving as a reference plane is disposed on the outermost insulating layer 210 corresponding to a region/area W of the substrate 202, such that the fourth conductive layer 215 substantially covers the plurality of non-ground net 303a. The fourth conductive layer 215 may be formed of solid metal sheet (such as metal foil/tape which comprises Al, Cu, Ag, or Au). In another embodiment, the fourth conductive layer 215 can be formed from a conductive epoxy or conductive epoxy adhesive (such as conductive silver, copper, or aluminum epoxy or the like). In another embodiment, the fourth conductive layer 215 can be manufactured from a polymer conductive composite, conductive polymer, conductive composite polymer, or carbon printing.

The fourth conductive layer 215 is electrically connected to the ground net 309b through openings 221 formed in the outermost insulating layer 210 so as to connect to a ground potential. In one embodiment, the openings 221 may be filled with conductive epoxy material or conductive adhesive material so as to form a unity structure with the fourth conductive layer 215. In another embodiment, a conductive device (not shown), e.g. screw, pin, jumper etc., is placed through the opening 211 to electrically connect the fourth conductive layer 215 and ground net 309b. In addition, in yet another embodiment of the application, the fourth conductive layer 215 may electrically connect to ground net 309b through not only the conductive device but also the conductive epoxy material filled into the openings 221.

Coupling coefficient between the adjacent non-ground net 303a (such as signal net) can be reduced and the EMI can be mitigated by the fourth conductive layer 215 (i.e., the reference plane) in the similar micro-strip geometry. Note that in order to effectively suppress the crosstalk noise (i.e., the coupling coefficient) and mitigate the EMI, a spacing H2 between the fourth conductive layer 215 and the third conductive layer 309 is less than 1 mm, preferable ranged between 50 μm to 350 μm, such that the ground net 309b and the non-ground net 309a are substantially close to the fourth conductive layer 215 in a vertical direction with respect to the bottom surface 202b of the substrate 202. Additionally, an optional second insulating cap layer 216 may be disposed on the outermost insulating layer 210 to cover the fourth conductive layer 215. The second insulating cap layer 216 may comprise the same or similar material as that of the outermost insulating layer 210 to protect the fourth conductive layer 215 from mechanical or chemical damage.

Figure 3:
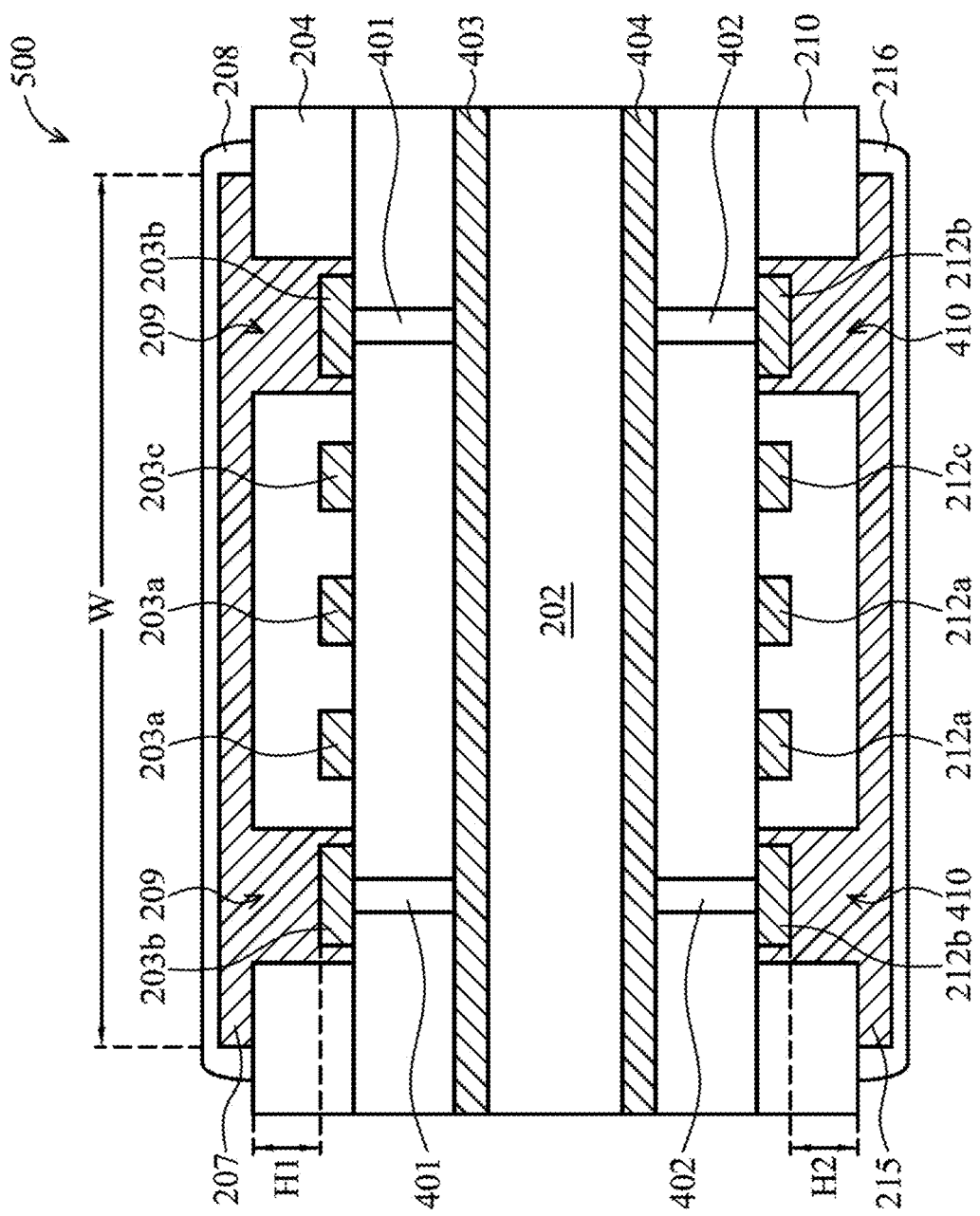
FIG. 3 illustrates a cross section of an exemplary embodiment of a four-layered printed circuit board according to the invention.

Referring to FIG. 3, which illustrates a cross section of an exemplary embodiment of a four-layered printed circuit board according to the invention. Elements in FIG. 3 that are similar to those in FIGS. 1, 2A and 2B are labeled with the same reference numbers as in FIGS. 1, 2A and 2B and are not described again for brevity. In the embodiment, the printed circuit board 500 comprises a substrate 202. Outermost insulating layer 204 and 210 are disposed on the top and bottom surfaces 202a and 202b of the substrate 202, respectively, as the embodiment shown in FIG. 2A or 2B.

Unlike the embodiment shown in FIG. 2A or 2B, third signal net 212a and fourth signal net 212b and 212c are embedded in the outermost insulating layer 210. Moreover, the third signal net 212a and the fourth signal net 212b and 212c are formed of the same conductive layer, such as copper, aluminum, copper alloy or aluminum alloy. The fourth signal net 212b and 212c may be configured as traces or planes, and partially with pads, fingers, or via holes. In the embodiment of the application, the outermost insulating layer 210 has openings 410 to expose at least one pad, via hole, a portion of a trace or plane of the fourth signal net 212b.

A first reference plane 403 (such as a ground or power net) is embedded in the substrate 202 and is electrically connected to the second signal net 203b by via holes 401 formed in the substrate 202. A second reference plane 404 (such as a power or ground net) is embedded in the substrate 202 and is electrically connected to the fourth signal net 212b by via holes 402 formed in the substrate 202.

In one embodiment, the second signal net 203b may be electrically connected to ground potential (i.e., the first reference plane 403 serves as a ground net), while the second signal net 203c are electrically connected to a power source having a voltage potential. The fourth signal net 212b may be electrically connected to a power source (i.e., the second reference plane 404 serves as a power net), while the fourth signal net 212c are electrically connected to the ground potential. Alternatively, the second signal net 203b may be electrically connected to a power source (i.e., the first reference plane 403 serves as a power net), while the second signal net 203c are electrically connected to the ground potential. The fourth signal net 212b may be electrically connected to the ground potential (i.e., the second reference plane 404 serves as a ground net), while the fourth signal net 212c are electrically connected to a power source.

In particular, the second conductive layers 207 and the fourth conductive layer 215 are disposed on the outermost insulating layers 204 and 210 corresponding to the region/area W, such that the second conductive layer 207 substantially covers the first signal net 203a, and second signal net 203b and 203c, while the fourth conductive layer 215 substantially underlies the third signal net 212a, and the fourth signal net 212b and 212c. In another embodiment, the second signal net 203c and the fourth signal net 212c may be outside the region/area W. The fourth conductive layer 215 is electrically connected to the fourth signal net 212b through openings 410 formed in the outermost insulating layer 210. In one embodiment, the fourth conductive layer 215 is electrically connected to the ground potential when the fourth signal net 212b and the second reference plane 404 serve as a ground net, while the second conductive layer 207 is electrically connected to a power source when the second signal net 203b and the first reference plane 403 serve as a power net. In this case, the fourth conductive layer 215 may be electrically connected to ground through the openings 410 by a screw, pin, jumper, conductive adhesive or conductive epoxy. In another embodiment, the fourth conductive layer 215 is electrically connected to the power source when the fourth signal net 212b and the second reference plane 404 serve as a power net, while the second conductive layer 207 is electrically connected to the ground potential when the second signal net 203b and the first reference plane 403 serve as a ground net. As a result, the first signal net 203a and the third signal net 212a have a strip-line configuration.

Crosstalk noise between the first signal net 203a and that of between the third signal net 212a can be virtually suppressed by the respective micro-strip geometry. Also, the spacing H1 and H2 are less than 1 mm, preferable in a range of 50 μm to 350 μm, such that the first signal net 203a and the second signal net 203b and 203c are substantially close to the second conductive layers 207 in a vertical direction with respect to the top surface 202a of the substrate 202, while the third signal net 212a and the fourth signal net 212b and 212c are substantially close to the fourth conductive layers 215 in a vertical direction with respect to the bottom surface 202b of the substrate 202. Additionally, an optional second insulating cap layer 216 may be disposed on the outermost insulating layer 210 and covers the fourth conductive layer 215 to protect the fourth conductive layer 215 from mechanical or chemical damage.

Figure 4:
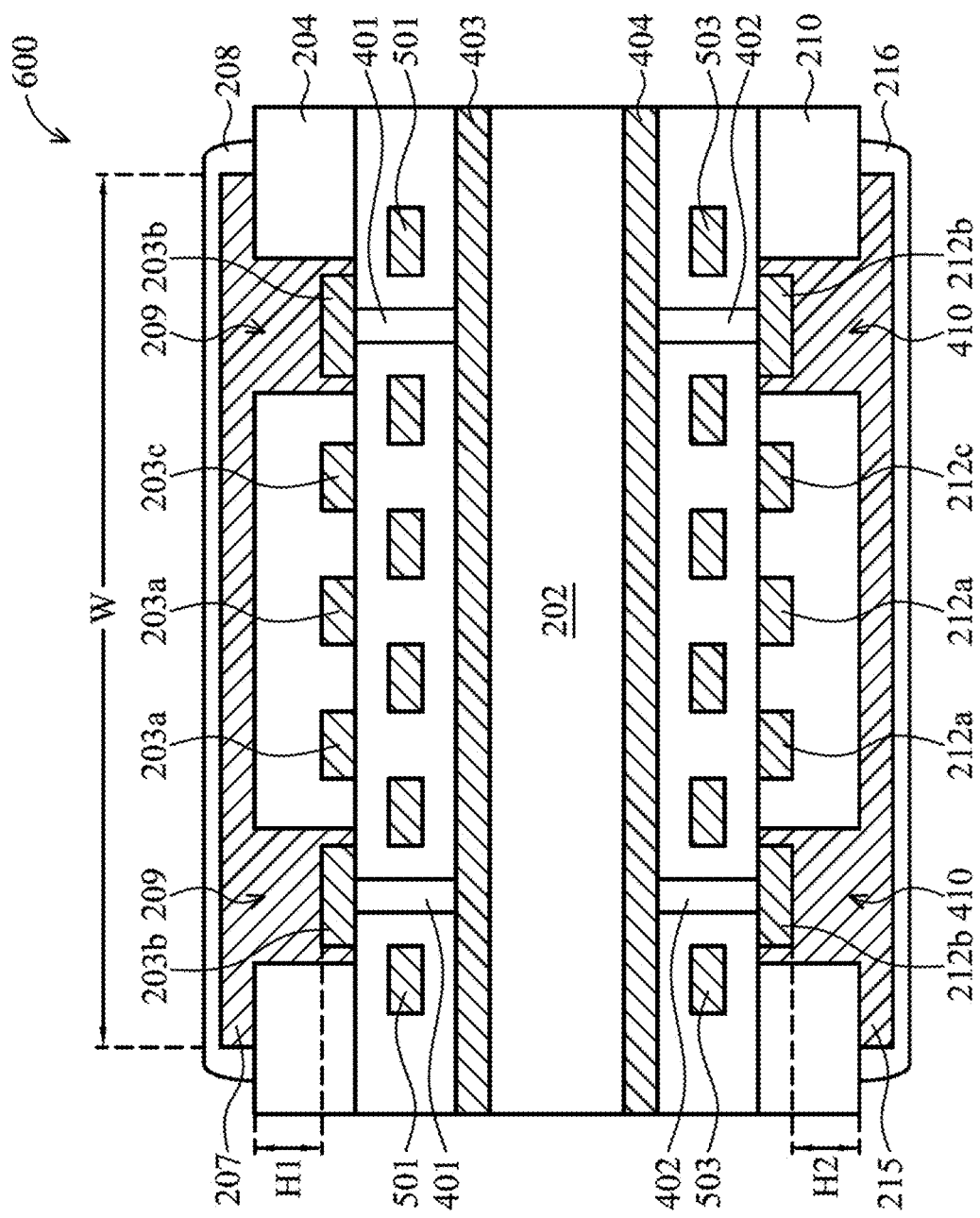
FIG. 4 illustrates a cross section of an exemplary embodiment of a six-layered printed circuit board according to the invention.

Referring to FIG. 4, which illustrates a cross section of an exemplary embodiment of a six-layered printed circuit board according to the invention. Elements in FIG. 4 that are similar to those in FIG. 3 are labeled with the same reference numbers as in FIG. 3 and are not described again for brevity. Comparing to the embodiment of FIG. 3, the six-layered printed circuit board 600 further comprise a plurality of fifth signal net 501 and a plurality of sixth signal net 503 embedded in the substrate 202, in which the plurality of the fifth signal net 501 are disposed between the first reference plane 403 and the outermost insulating layer 204, and the plurality of the sixth signal net 503 are disposed between the second reference plane 404 and the outermost insulating layer 210.

Figure 5A:
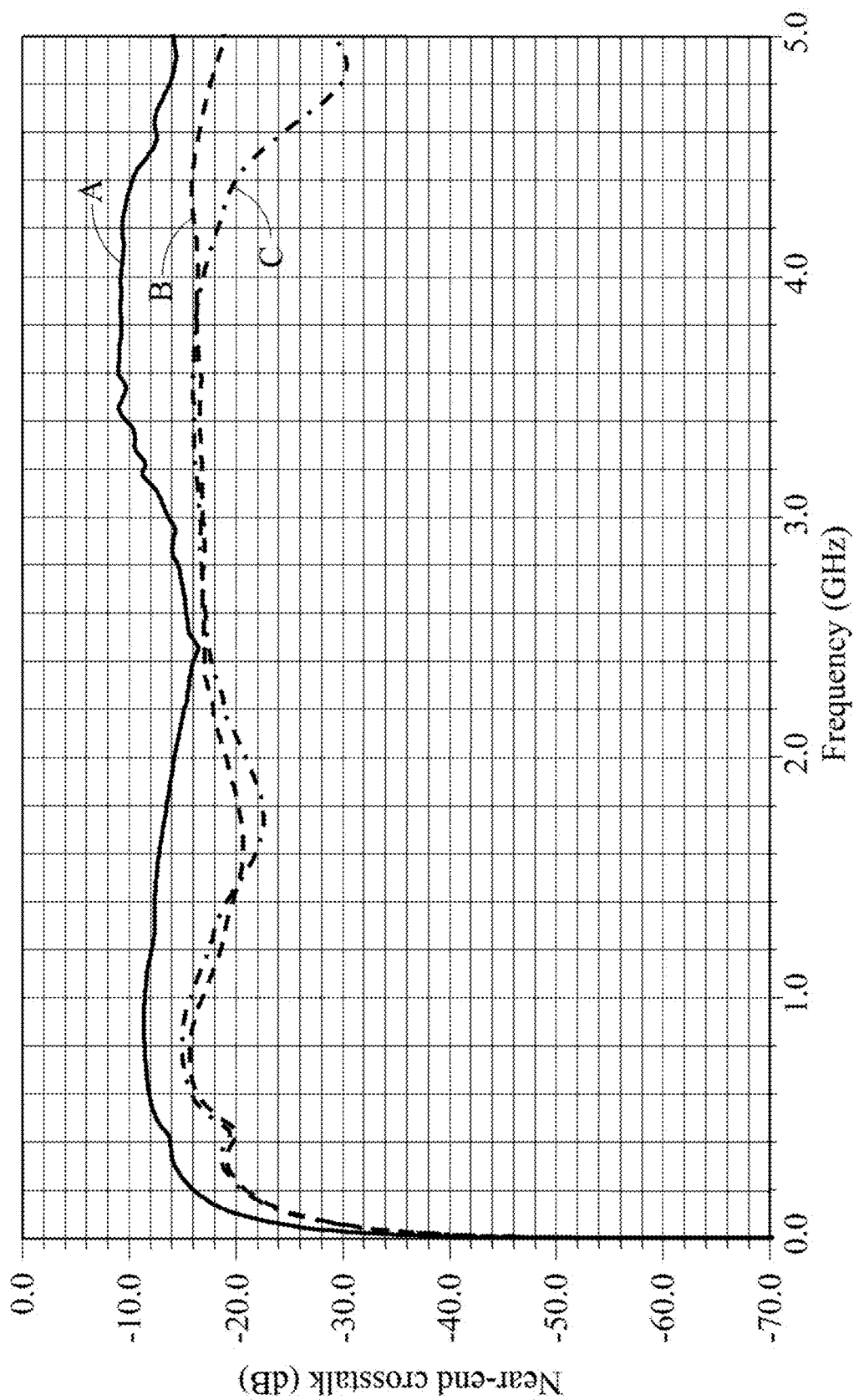
FIG. 5A illustrates a simulation diagram showing a relationship between near-end crosstalk and frequency for signal traces of two-layered printed circuit boards as the embodiment shown in FIG. 2.
Figure 5B:
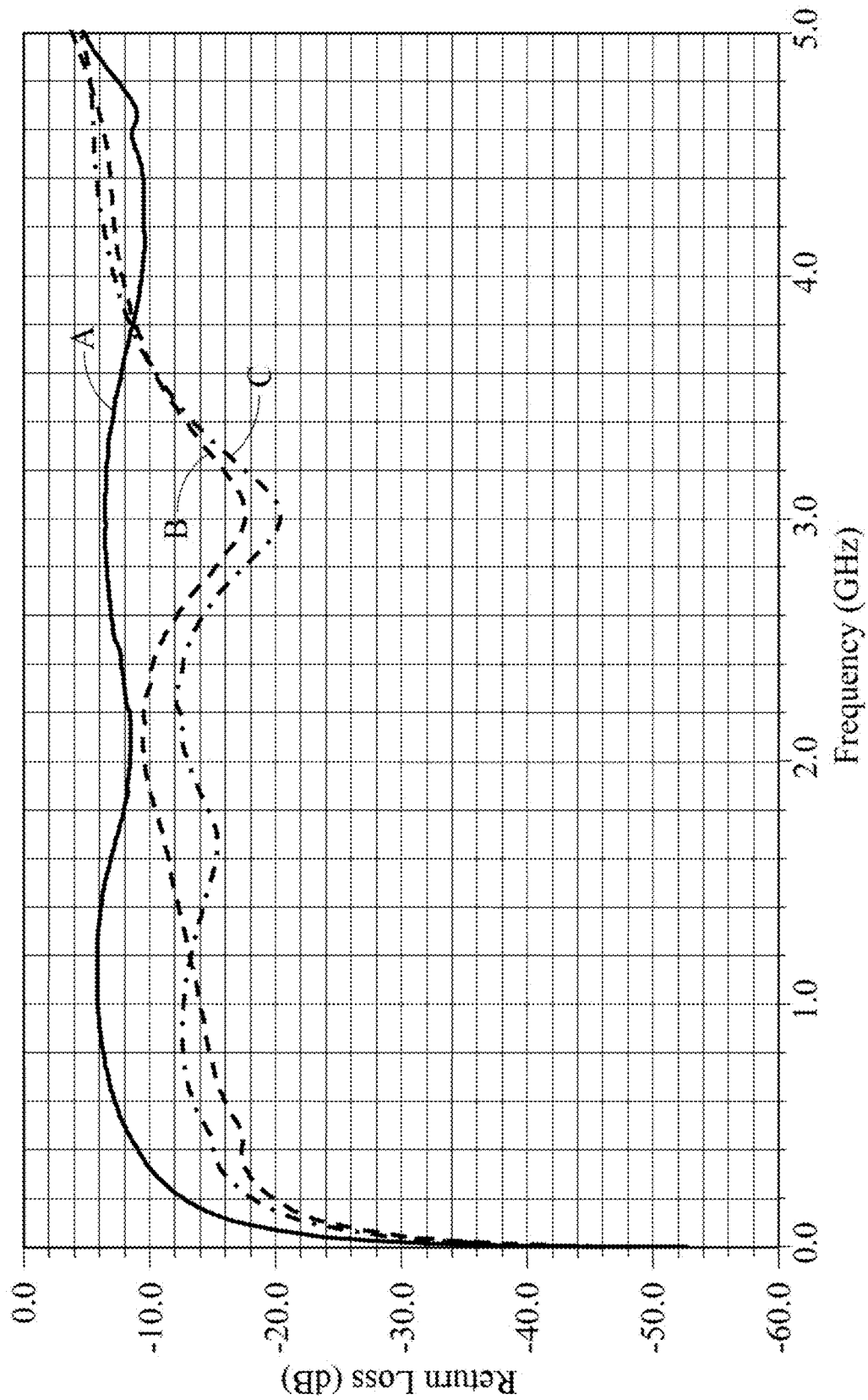
FIG. 5B illustrates a simulation diagram showing a relationship between return loss and frequency for signal traces of two-layered printed circuit boards as the embodiment shown in FIG. 2.

Referring to FIGS. 5A and 5B, FIG. 5A is a simulation diagram showing a relationship between near-end crosstalk (dB) and frequency (GHz) for signal traces of two-layered printed circuit boards as the embodiment shown in FIG. 2, and FIG. 5B is a simulation diagram showing a relationship between return loss and frequency for signal net of two-layered printed circuit board for signal traces of two-layered printed circuit boards as the embodiment shown in FIG. 2. In FIGS. 5A and 5B, the curve A represents signal net of a conventional two-layered printed circuited board without any additional conductive layer disposed on the outermost insulating layer thereon. The curves B and C represent first signal net 203a of a two-layered printed circuited board 400a or 400b with a second conductive layer 207 having a thickness of 100 μm and a spacing H1 of 80 and 110 μm, respectively (as shown in FIG. 2A), and with a fourth conductive layer 215 on an outermost insulating layer 210 having a thickness of 100 μm and a spacing H2 of 80 and 110 μm, respectively (as shown in FIG. 2B). As shown in FIGS. 5A and 5B, the near-end crosstalk and return loss of the signal net during high frequency operations can be reduced by the additional conductive layers 207 and 215.

According to the aforementioned embodiments, since there is an additional conductive layer, which is connected to a ground potential or a power source, disposed on the outermost insulating layer of the printed circuit board and close to the high-speed signal net embedded therein, the crosstalk noise and EMI can be effectively suppressed. Moreover, the formation of such an additional conductive layer (serving as a reference plane) is easy and has a lower fabrication cost when compared with using multi-layered PCBs (such as a 4-layer PCB) with separated power, signal and ground net in various layers. Accordingly, an economic benefit can be obtained by using of a less-layer PCB with the mentioned additional conductive layer for high-speed applications.

Figure 6A:
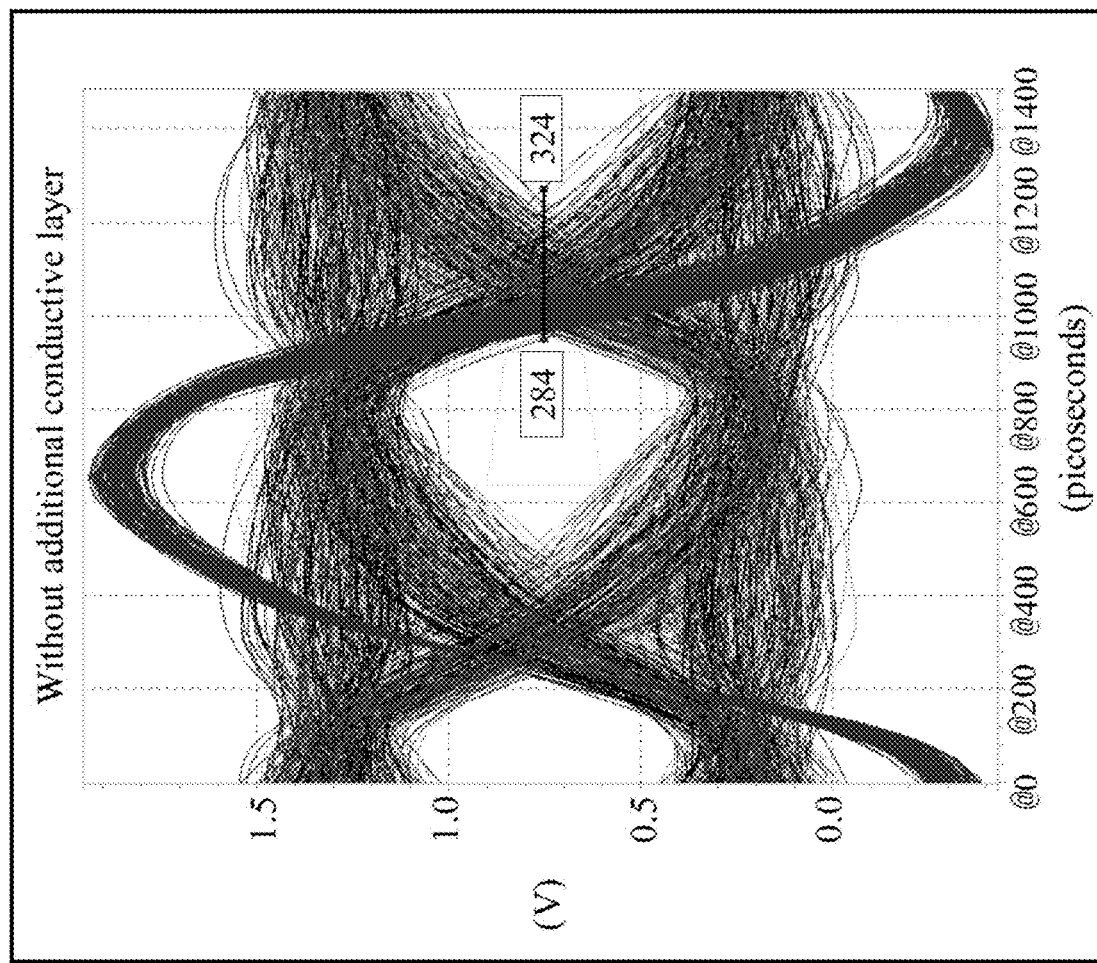
FIGS. 6A to 6C are an exemplary simulation diagram in time domain showing an eye-open of one byte of writing data signals transmitted through a DDR3 DRAM interface.
Figure 6B:
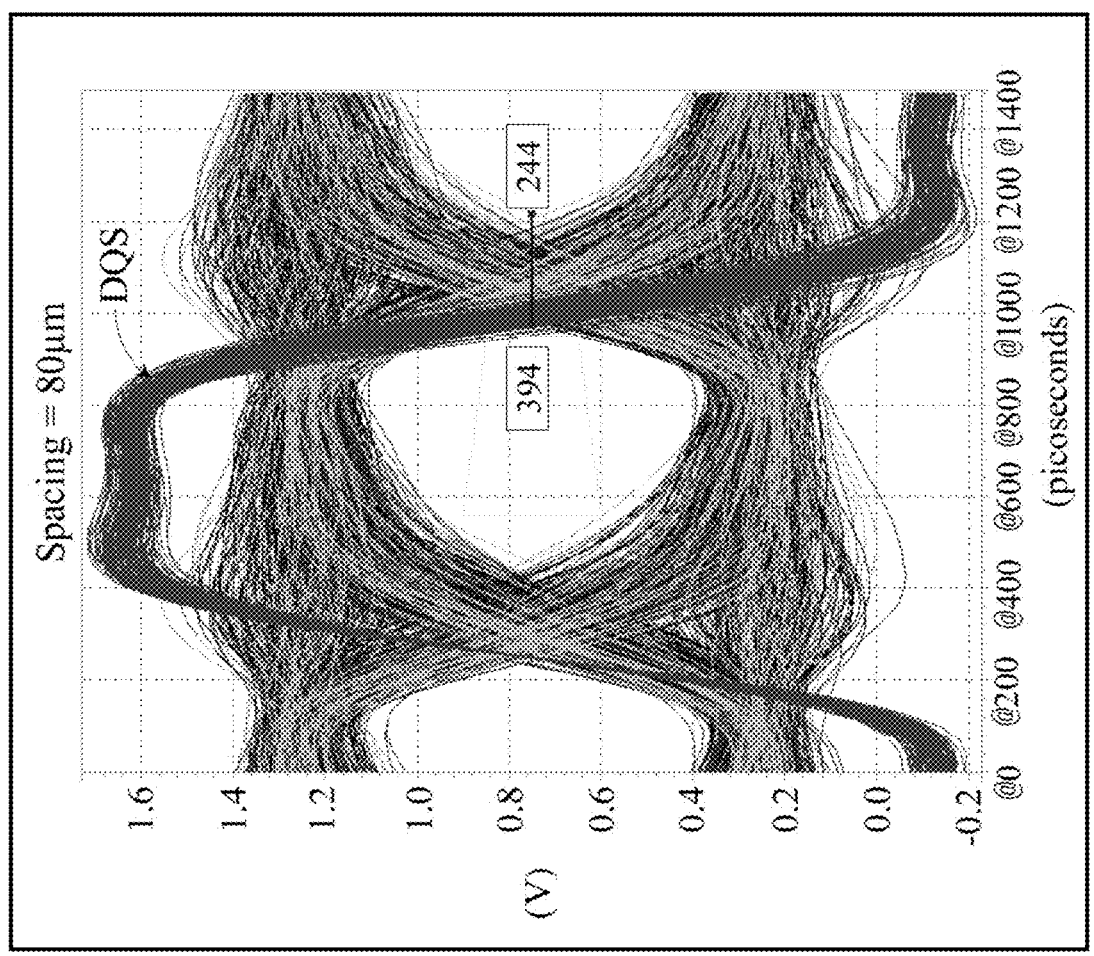
Figure 6C:
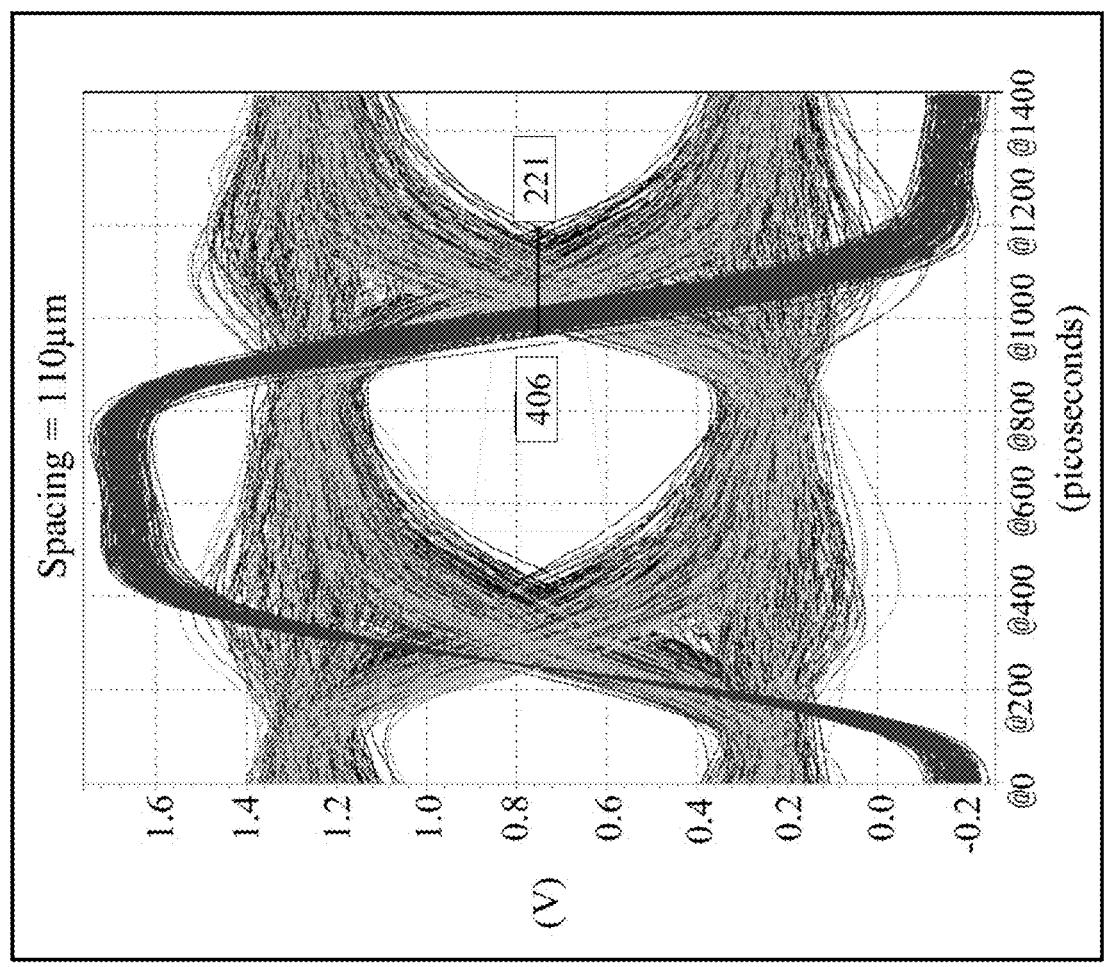

Please refer to FIGS. 6A to 6C and Table 1. FIGS. 6A to 6C are an exemplary simulation diagram in time domain showing an eye-open of one byte of writing data signals transmitted through a DDR3 DRAM interface at 1350 Mb/s with an on-die termination of 120 ohms at the DRAM side. Table 1 shows the measurement result of the eye-open shown in FIGS. 6A to 6C. As shown in FIGS. 6A to 6C and Table 1, the larger eye open makes the better voltage and timing margins.

TABLE 1

| | Type | | |
|---|---|---|---|
| Item | Conventional design | Spacing (H1, H2) = 80 μm | Spacing (H1, H2) = 110 μm |
| $V_{IH(dc)}$ margin (mV) | 160 | 250 | 270 |
| $V_{IL(dc)}$ margin (mV) | 220 | 250 | 286 |
| Overshoot (V) | 1.61 | 1.56 | 1.55 |
| Undershoot (V) | −0.11 | −0.13 | −0.12 |
| Skew (ps, $V_{ref}$ to $V_{ref}$) | 324 | 244 | 221 |
| H. Eye-open (ps) | 284 | 394 | 406 |

Figure 7A:
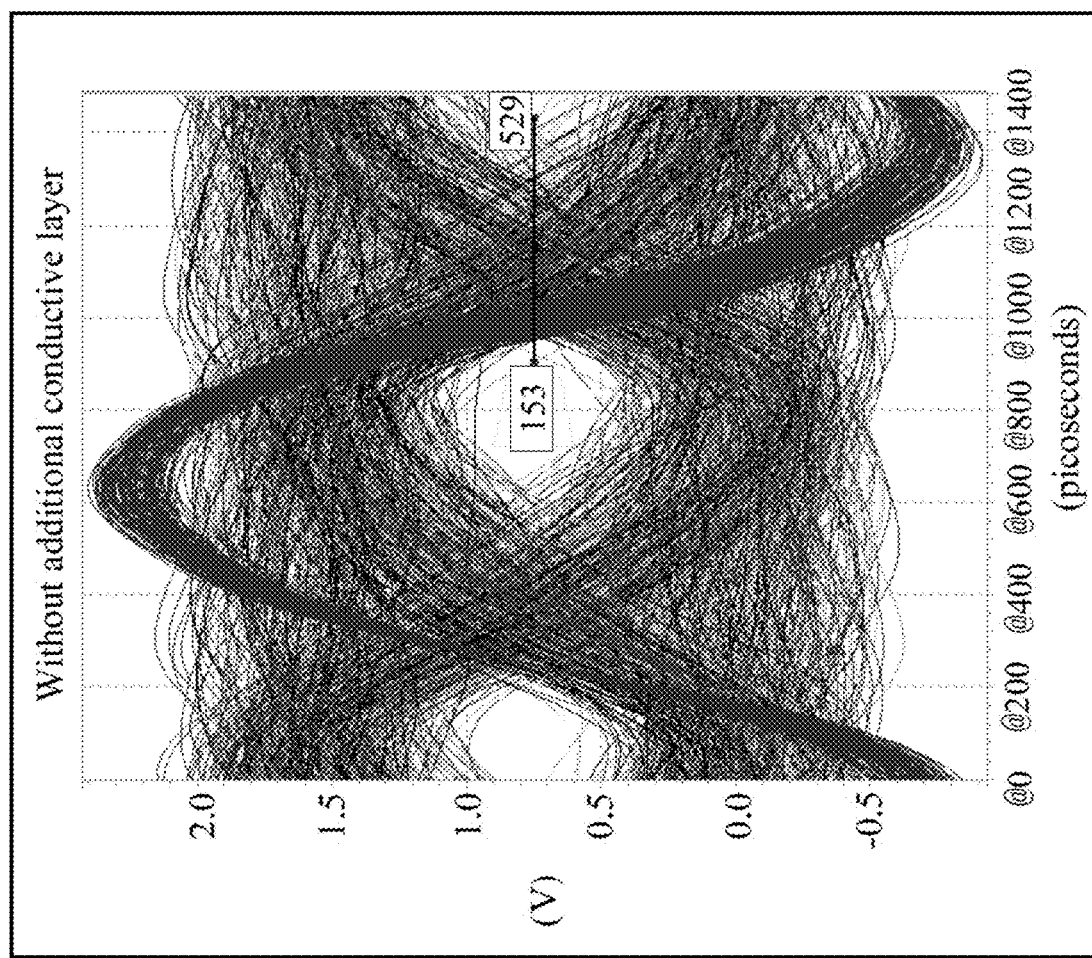
FIGS. 7A to 7C are an exemplary simulation diagram in time domain showing an eye-open of one byte of writing data signals transmitted through a DDR3 DRAM interface.
Figure 7B:
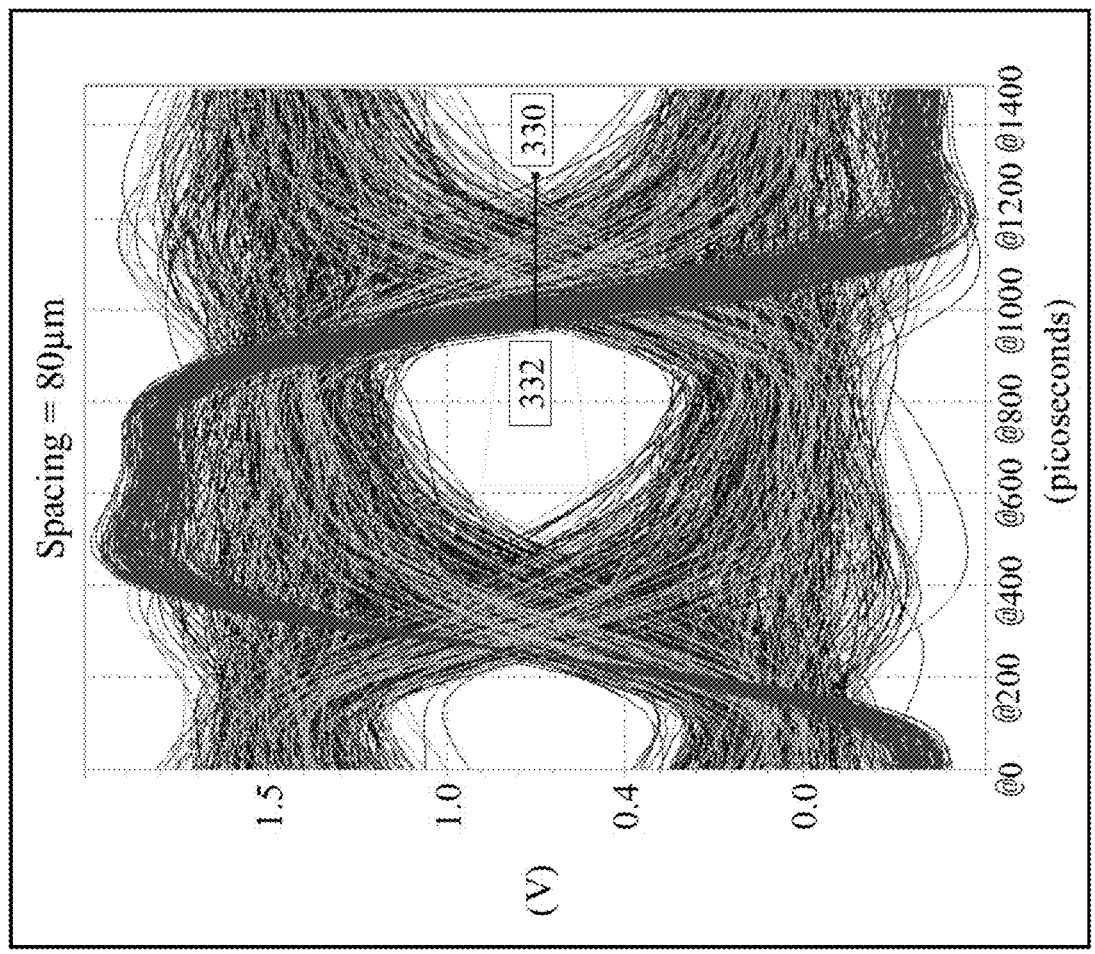
Figure 7C:
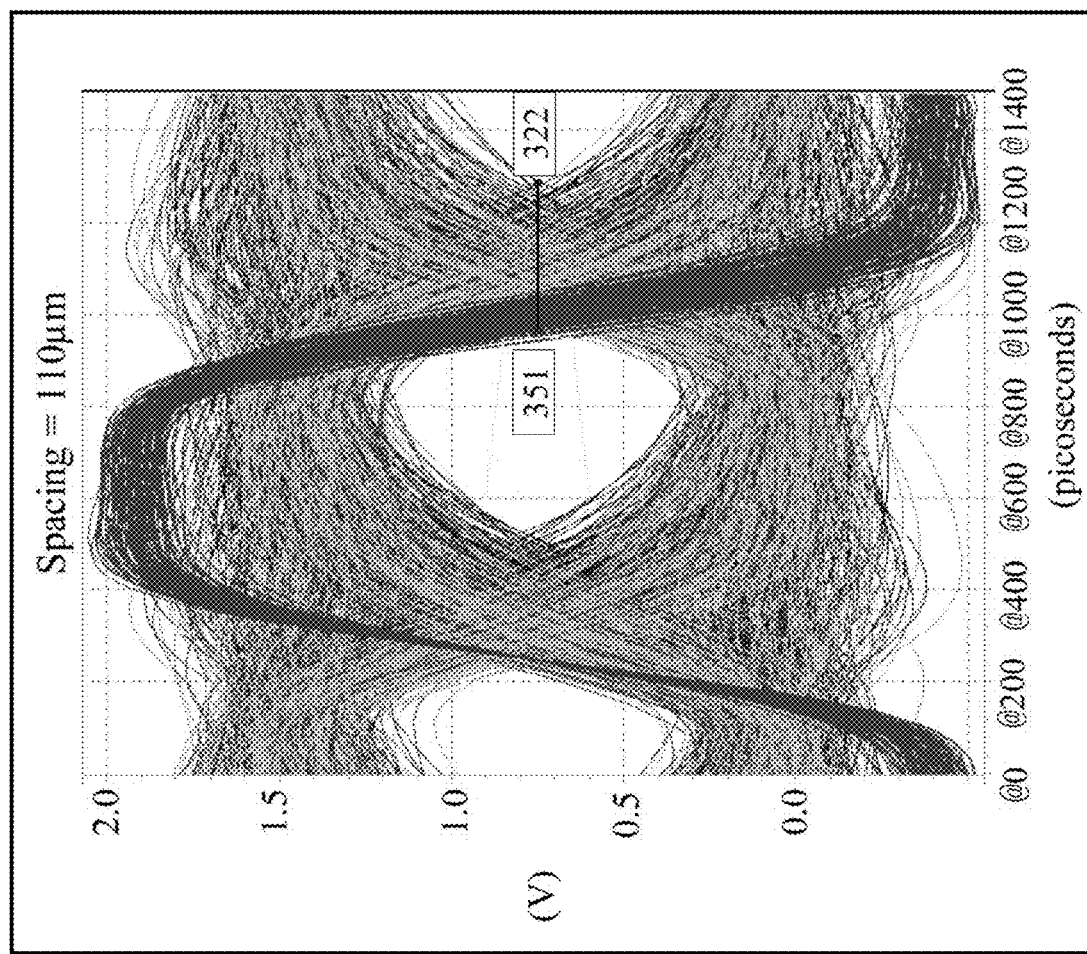
Figure 8A:
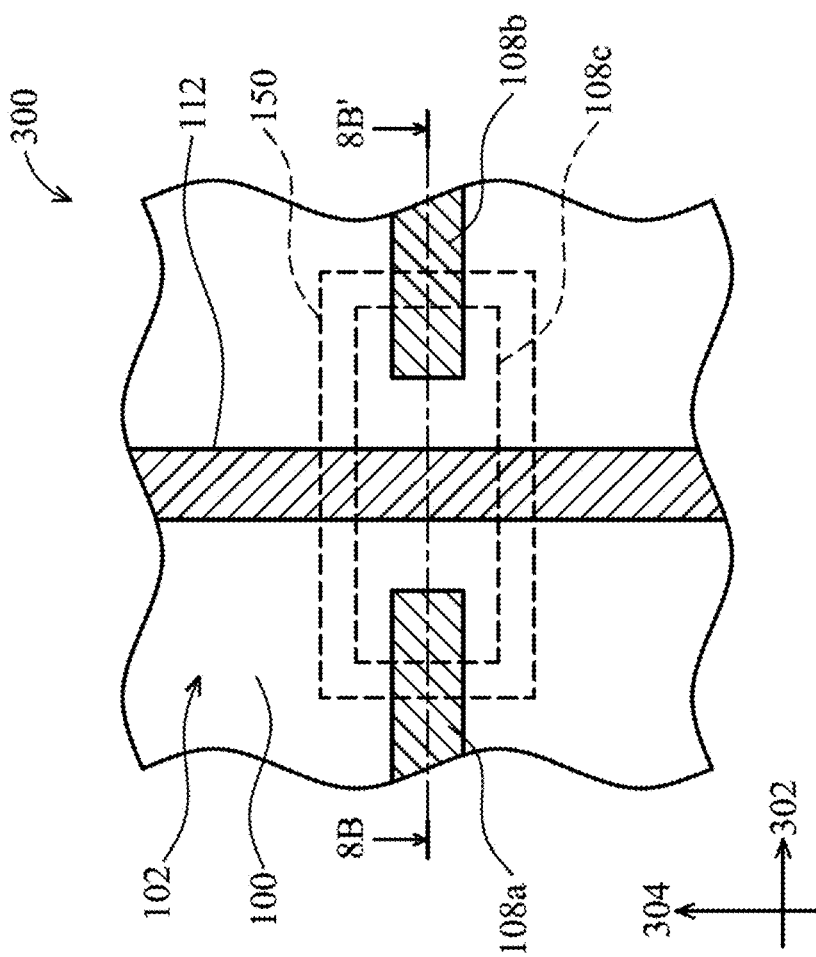
FIG. 8A shows a plan view of a conventional two-layered printed circuit board.
Figure 8B:
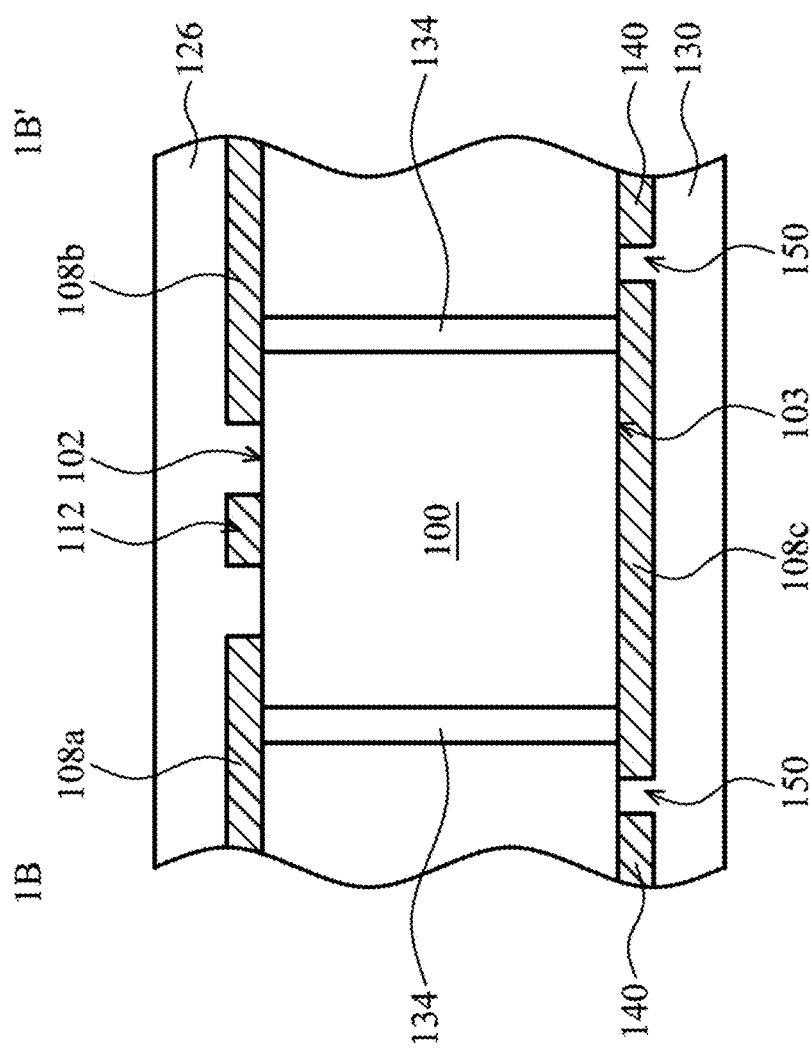
FIG. 8B shows a cross section along line 8B-8B' of FIG. 8A.

Please refer to FIGS. 7A to 7C and Table 2. FIGS. 7A to 7C are an exemplary simulation diagram in time domain showing an eye-open of one byte of writing data signals transmitted through a DDR3 DRAM interface at 1350 Mb/s without on-die termination at the DRAM side. Table 2 shows the measurement result of the eye-open shown in FIGS. 7A to 7C. As shown in FIGS. 7A to 7C and Table 2, the larger eye open makes the better voltage and timing margins.

TABLE 2

| | Type | | |
|---|---|---|---|
| Item | Conventional design | Spacing (H1, H2) = 80 μm | Spacing (H1, H2) = 110 μm |
| VIH(dc) margin (mV) | 107 | 280 | 320 |
| VIL(dc) margin (mV) | 157 | 279 | 315 |
| Overshoot (V) | 2.15 | 1.92 | 1.94 |
| Undershoot (V) | −0.63 | −0.50 | −0.52 |
| Skew (ps, Vref to Vref) | 529 | 330 | 322 |
| H. Eye-open (ps) | 153 | 332 | 351 |

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A printed circuit board, comprising: a substrate having a top surface and a bottom surface;
   a first conductive layer disposed on the top surface of the substrate, wherein the first conductive layer is in contact with the substrate and comprises three first signal nets, and two second signal nets, one on the left of the first signal nets and the other on the right of the first signal nets;
   an outermost insulating layer disposed on the top surface of the substrate to cover the substrate and the first conductive layer, wherein the outmost insulating layer is in contact with the substrate and comprises openings to fully expose a top and sides of both the second signal nets; and
   a second conductive layer disposed on the outermost insulating layer and substantially covering at least a portion of the first signal nets, including the exposed tops and sides of both the second signal nets,
   wherein the second conductive layer which is able to provide one of a ground potential and a power potential is electrically connected to both the second signal nets through the openings,
   wherein the first signal nets are disposed between the second signal nets, and the second signal nets comprises a via hole which is exposed from the openings,
   wherein the entirety of the first conductive layer is disposed on the top surface of the substrate, and some of the top surface of the substrate is not covered by the first conductive layer.

2. The printed circuit board of claim 1, further comprising a third conductive layer disposed on the bottom surface of the substrate, wherein the third conductive layer comprises a third signal net and a fourth signal net, the fourth signal net is electrically connected to the second signal net through a first via hole formed in the substrate.

3. The printed circuit board of claim 2, wherein the third signal net is electrically connected to the first signal net through a second via hole formed in the substrate.

4. The printed circuit board of claim 1, further comprising a reference plane embedded in substrate wherein the reference plane is able to provide one of the ground potential and the power potential.

5. The printed circuit board of claim 4, wherein the reference plane is electrically connected to the second signal net by a via hole formed in the substrate.

6. The printed circuit board of claim 1, wherein the second conductive layer comprises metal sheet, conductive epoxy polymer conductive composite, or carbon printing.

7. The printed circuit board of claim 1, wherein the second conductive layer is electrically connected to the second signal net by one of a solder and conductive adhesive.

8. The printed circuit board of claim 1, wherein the second signal net further comprises a trace, plane, pad, or finger.

9. The printed circuit board of claim 1, further comprising an insulating cap layer covering the second conductive layer.

10. The printed circuit board of claim 1, wherein the thickness of second conductive layer is less than or equal to 100 μm.

11. The printed circuit board of claim 1, wherein the second conductive layer is filled into the openings to electrically connect to both the second signal nets.

12. The printed circuit board of claim 1, wherein a top portion of the outermost insulating layer is made of the same material as a bottom portion of the outermost insulating layer.

13. The printed circuit board of claim 1, wherein a spacing between the first conductive layer and the second conductive layer is between 50 μm to 350 μm.

14. The printed circuit board of claim 1, wherein the outermost insulating layer fully covers the first signal nets.

15. A printed circuit board, comprising: a substrate having a top surface and a bottom surface;
   a first conductive layer disposed on the top surface of the substrate, wherein the first conductive layer is in contact with the substrate and comprises three first signal nets, and two second signal nets, one on the left of the first signal nets, and the other on the right of the first signal nets;
   an outermost insulating layer disposed on the top surface of the substrate to cover the substrate and the first conductive layer, wherein the outmost insulating layer is in contact with the substrate and comprises openings to fully expose a top and sides of both the second signal nets;
   a second conductive layer disposed on the outermost insulating layer and substantially covering at least a portion of the first signal nets, including the exposed tops and sides of the second and third signal nets, wherein the second conductive layer which is able to provide one of a ground potential and a power potential is electrically connected to both the second signal nets through the openings; and
   a third conductive layer disposed completely under the bottom surface of the substrate, wherein the first signal nets are disposed between the second signal nets, and the second signal nets comprises a via hole which is exposed from the openings,
   wherein the entirety of the first conductive layer is disposed on the top surface of the substrate, and some of the top surface of the substrate is not covered by the first conductive layer.

16. The printed circuit board of claim 15, wherein the second conductive layer and the third conductive layer serve as reference planes to suppress crosstalk noise.

17. The printed circuit board of claim 15, wherein a spacing between the first conductive layer and the second conductive layer is between 50 μm to 350 μm.

18. A printed circuit board, comprising:
a substrate having a top surface and a bottom surface;
a first conductive layer disposed on the top surface of the substrate, wherein the first conductive layer is in contact with the substrate and comprises three first signal nets, and two second signal nets, one on the left of the first signal nets, and the other on the right of the first signal nets;
an outermost insulating layer disposed on the top surface of the substrate to cover the substrate and the first conductive layer, wherein the outmost insulating layer is in contact with the substrate and comprises openings to fully expose a top and sides of both the second signal nets; and
a second conductive layer disposed on the outermost insulating layer and covering a portion of the first signal nets, including the exposed tops and sides of both the second nets;
an insulating cap layer disposed on the second conductive layer, wherein the second conductive layer which is able to provide one of a ground potential and a power potential is electrically connected to both the second signal nets through the openings,
wherein a portion of the outermost insulating layer is uncovered by the second conductive layer, and the portion of the outermost insulating layer, which is thinner than the substrate, is uncovered by the insulating cap layer, and the insulating cap layer is wider than the second conductive layer and narrower than the outermost insulating layer,
wherein the first signal nets are disposed between the second signal nets, and the second signal nets comprises a via hole which is exposed from the openings,
wherein the entirety of the first conductive layer is disposed on the top surface of the substrate, and some of the top surface of the substrate is not covered by the first conductive layer.

19. The printed circuit board of claim 18, wherein a portion of the second conductive layer is sandwiched between a sidewall of the openings and the at least one side of the second signal net.

\* \* \* \* \*